(12) United States Patent
So (10) Patent No.: US 6,218,220 B1
(45) Date of Patent: Apr. 17, 2001

(54) METHOD FOR FABRICATING THIN FILM TRANSISTOR

(75) Inventor: Woo-Young So, Kyonggi-do (KR)

(73) Assignee: Samsung Display Devices Co., Ltd. (KR)

( * ) Notice: Subject to any disclaimer, the term of this patent is extended or adjusted under 35 U.S.C. 154(b) by 0 days.

(21) Appl. No.: 09/295,741

(22) Filed: Apr. 20, 1999

(30) Foreign Application Priority Data

May 19, 1998 (KR) .................................................. 98-17944

(51) Int. Cl.[7] .................................................. H01L 21/84
(52) U.S. Cl. ........................ 438/151; 438/153; 438/245; 438/354
(58) Field of Search .................................... 438/151, 153, 438/245, 354

(56) References Cited

U.S. PATENT DOCUMENTS

| | | | | |
|---|---|---|---|---|
| 5,395,804 | * | 3/1995 | Ueda | 437/233 |
| 5,403,755 | * | 4/1995 | Chae | 437/21 |
| 5,432,108 | * | 7/1995 | Lee | 437/40 |
| 5,466,619 | * | 11/1995 | Choi | 437/41 |
| 5,830,787 | * | 11/1998 | Kim | 438/163 |

* cited by examiner

Primary Examiner—Vu A. Le
Assistant Examiner—Pho Luu
(74) Attorney, Agent, or Firm—Baker & McKenzie (57) ABSTRACT

A method for fabricating a thin film transistor includes the steps of forming an active layer on a substrate, forming a metal gate electrode on the active layer, depositing a silicon layer on the metal gate electrode and the active layer, causing the metal gate electrode to react with the silicon layer to form a silicide layer around the metal gate electrode, removing the silicon layer, heavily doping impurities in the active layer using the silicide layer as a mask to form a source/drain region, removing the silicide layer, and lightly doping impurities in the active layer using the metal gate electrode as a mask to form an offset region.

8 Claims, 13 Drawing Sheets

METHOD FOR FABRICATING THIN FILM TRANSISTOR

BACKGROUND OF THE INVENTION

1. Field of the Invention

The present invention relates to a thin film transistor (TFT) and a method for fabricating the same and, more particularly, to a thin film transistor which has an offset region formed in a channel region so as to reduce current leakage which may be generated through the channel region when the TFT is turned OFF, and a method for fabricating the same.

2. Description of the Prior Art

Generally, polysilicon is widely used in manufacturing integrated circuits or semiconductor devices such as TFTs because of its effective switching performance and integration ability. Therefore, when the TFT made of polysilicon is applied to an active matrix liquid crystal display, a drive circuit for driving a pixel of the liquid crystal display and TFTs can be formed on a same substrate.

However, the TFT made of polysilicon has a drawback in that when it is turned OFF, current leakage may occur because of deterioration of the OFF characteristic.

In an effort to overcome this problem, an offset region where impurities are not doped or lightly doped (hereinafter referred to as an "offset region") is formed in a channel region of the TFT so as to reduce the current leakage which flows from a drain region and/or a source region to a gate when the TFT is turned OFF.

Figure 5:
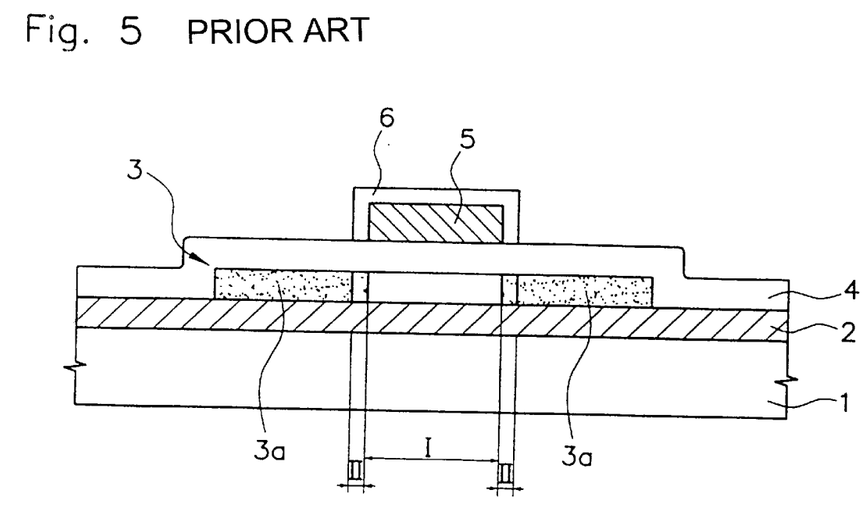
FIG. 5 is a sectional view illustrating a convention TFT where a gate electrode is made of a polysilicon.

FIG. 5 shows a conventional TFT in which a gate electrode is made of polysilicon.

A buffer layer 2 is first formed on a substrate 1, after which an active layer forming material such as polysilicon is deposited on the buffer layer 2. Next, the active layer forming material is etched through a photolithography process, thereby forming an active layer 3 on the buffer layer 2. A gate oxide layer 4 is deposited on the active layer 3, after which a gate electrode forming material such as a polysilicon is deposited on the gate oxide layer 4, then etched through a photolithography process, thereby forming a gate electrode 5.

Following the above, impurities are lightly doped in the active layer 3 using the gate electrode 5 as a mask. Next, the gate electrode 5 is heat-treated at a high temperature so that an oxide layer 6 is formed on a surface of the gate electrode 5, after which impurities are heavily doped in the active layer 3 using the oxide layer 6 as a mask.

As a result, a portion of the active layer 3 corresponding to the oxide layer 6 becomes an offset region II where the impurities are lightly doped, while other portions of the active layer 3 becomes a source/drain region 3a where the impurities are heavily doped. That is, the active layer 3 comprises a channel region I where the impurities are not doped, the lightly doped offset region II, and the source/drain region 3a through which electric signals are applied.

In the above described structure, since the source/drain region 3a is spaced away from the gate electrode 5 by the offset region II, an electric field effect from source and drain terminals having a predetermined electric potential to the gate electrode 5 is reduced. As a result, when the TFT is turned OFF, current leakage between the source and drain terminals is reduced, thereby improving an Off-current characteristic of the TFT.

However, in the TFT structured as in the above, heat treating the gate electrode to form the oxide layer may deform the substrate, deteriorating a reliability of the resultant TFT. In addition, during the heat treatment process, the impurities lightly doped in the active layer may be activated, making it difficult to form a precise profile. When the polysilicon used for the gate electrode has a high resistance, the TFT made of the polysilicon cannot be applied to a large-sized liquid crystal display.

Therefore, to overcome the above drawbacks, there is disclosed a conventional method for forming the gate electrode using metal.

Figure 6:
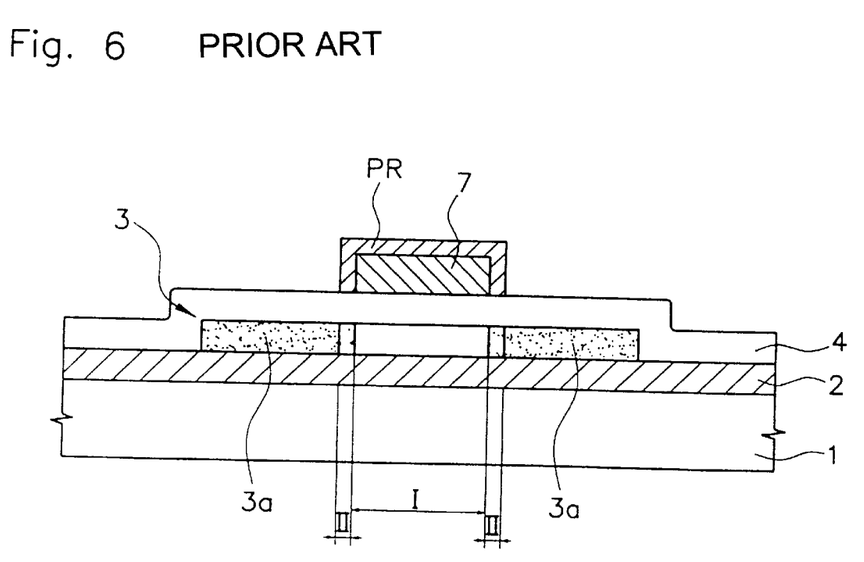
FIG. 6 is a sectional view illustrating a convention TFT where a gate electrode is made of a metal.

FIG. 6 shows a conventional TFT in which a gate electrode is made of a metal.

A buffer layer 2 is first formed on a substrate 1, after which an active layer forming material such as a polysilicon is deposited on the buffer layer 2. Next, the active layer forming material is etched through a photolithography process, thereby forming an active layer 3 on the buffer layer 2. A gate oxide layer 4 is deposited on the active layer 3, after which a gate electrode forming material such as metal is deposited on the gate oxide layer 4, then etched through a photolithography process, thereby forming a metal gate electrode 7.

Following the above, impurities are lightly doped in the active layer 3 using the metal gate electrode 7 as a mask. Next, a photoresist pattern PR is formed around the metal gate electrode 7, after which impurities are heavily doped in the active material 3 using the photoresist pattern PR as a mask.

As a result, a portion of the active layer 3 corresponding to the photoresist pattern PR becomes an offset region II where the impurities are lightly doped, while other portions of the active layer 3 becomes a source/drain region 3a where the impurities are heavily doped. That is, the active layer 3 comprises a channel region I where the impurities are not doped, the lightly doped offset region II, and the heavily doped source/drain region 3a through which electric signals are applied.

However, in the above described method, the additional masking process for forming the photoresist pattern around the metal gate electrode makes the overall process for making the TFT complicated.

SUMMARY OF THE INVENTION

The present invention has been made in an effort to solve the above problems.

It is an objective of the present invention to provide a method for fabricating a TFT which can form an offset region while allowing a gate electrode to have a high resistance.

To achieve the above objective, a first embodiment of the present invention provides a method for fabricating a thin film transistor, comprising the steps of forming an active layer on a substrate, forming a metal gate electrode on the active layer, depositing a silicon layer on the metal gate electrode and the active layer, causing the metal gate electrode to react with the silicon layer to form a silicide layer around the metal gate electrode, removing the silicon layer, heavily doping impurities in the active layer using the silicide layer as a mask to form a source/drain region, removing the silicide layer, and lightly doping impurities in the active layer using the metal gate electrode as a mask to form an offset region.

The step of causing the metal gate electrode to react with the silicon layer is performed through a heat-treatment process at a predetermined temperature. Preferably, the predetermined temperature is in a range of 300 to 500° C.

The metal gate electrode is formed of a material selected from the group consisting of cobalt (Co), chrome (Cr), iridium (Ir), manganese (Mn), nickel (Ni), palladium (Pd) and lead (Pt)

According to a second embodiment of the present invention, a method for fabricating a thin film transistor comprises the steps of forming an active layer on a substrate, forming a gate electrode on the active layer, lightly doping impurities in the active layer using the gate electrode as a mask, depositing a first layer on the gate electrode and the active layer, causing the gate electrode to react with the first layer to form a silicide layer around the gate electrode, and heavily doping impurities in the active layer using the silicide layer as a mask to form a source/drain region.

The gate electrode is formed of a metal material, and the first layer is formed of a silicon material. The gate electrode is formed of a silicon material, and the first layer is formed of a metal material.

Preferably, the gate electrode is formed of a metal material selected from the group consisting of cobalt, chrome, iridium, manganese, nickel, palladium, and lead.

According to a third embodiment of the present invention, a method for fabricating a thin film transistor comprises the steps of forming an active layer on a substrate, forming a metal layer pattern and a first layer pattern on the active layer in this order, depositing a silicon layer on the metal layer pattern, the first layer pattern and the active layer, causing the metal layer pattern to react with the silicon layer to form a silicide layer around the metal layer pattern, removing the silicon layer, heavily doping impurities in the active layer using the silicide layer as a mask to form a source/drain region, removing the silicide layer, and lightly doping impurities in the active layer using the metal layer pattern as a mask to form an offset region. The first layer pattern may be removed together with the silicide layer.

Preferably, the metal layer pattern is formed of a material which easily react with the silicon material at the temperature of 300 to 500° C. such that the silicide layer can be easily formed around the metal layer pattern, while the first layer is formed of a material which does not react with the silicon material at the temperature of 300 to 500° C.

The metal layer pattern is formed of a material selected from the group consisting of cobalt, chrome, manganese, and nickel, and the first layer is formed of a metal material selected from the group consisting of molybdenum, titanium, tungsten, and zirconium, or an insulating material. The insulating material is selected from the group consisting of a silicon oxide and a silicon nitride.

According to a fourth embodiment of the present invention, a method of fabricating a thin film transistor comprises the steps of forming an active layer on a substrate, forming first and second metal patterns on the active layer in this order, lightly doping impurities in the active layer using the first and second metal patterns as a mask, depositing a silicon layer on the second metal pattern and the active layer, causing the second metal pattern to react with the silicon layer to form a silicide layer around the second metal pattern, removing the silicon layer, and heavily doping impurities in the active layer using the silicide layer as a mask to form a source/drain region.

The first metal pattern is formed of a material which does not react with the silicon material at the temperature of 300 to 500° C., while the second metal pattern is formed of a material which easily reacts with the silicon material at the temperature of 300 to 500° C. such that the silicide layer can be easily formed around the second metal pattern.

It is another objective of the present invention to provide a thin film transistor in which a gate electrode has a high resistance.

To achieve this objective, the present invention provides a thin film transistor comprising a substrate, an active layer deposited on the substrate, a gate pattern formed on the active layer, a first layer pattern formed on the gate pattern, the surface area of the first layer pattern being bigger than that of the gate pattern, a channel region formed on a portion of the active layer corresponding to the first layer pattern, a source/drain region formed in the active layer at both sides of the channel region, and an offset region defined between the channel region and the source/drain region.

The gate pattern is formed of a material selected from the group consisting of cobalt, chrome, manganese, and nickel, and the first layer pattern is formed of a material selected from the group consisting of molybdenum, titanium, tungsten, and zirconium, or an insulating material. The insulating material is selected from the group consisting of a silicon oxide and a silicon nitride.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF PREFERRED EMBODIMENT

Various embodiments of the present invention will now be described in detail with reference to the accompanying drawings. Wherever possible, the same reference numbers will be used throughout the drawings to refer to the same or like parts.

FIGS. 1a to 1f illustrate, in cross-section, a portion of a TFT as it undergoes sequential processing steps for being manufactured according to a first embodiment of the present invention.

Figure 1A:
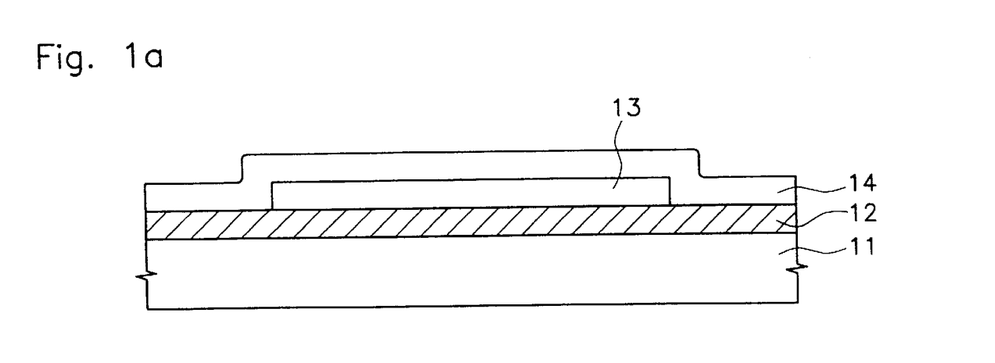
FIGS. 1a to 1f illustrate, in cross-section, a portion of a TFT as it undergoes sequential processing steps for being manufactured according to a first embodiment of the present invention.

Referring first to FIG. 1a, a buffer layer 12, an active layer 13, and a gate oxide layer 14 are first formed on a substrate 11 in this order. Next, a metal gate electrode forming material 15 is deposited on the gate oxide layer 14 to form a metal gate electrode 15a through a patterning process (see FIGS. 1b and 1c). A silicon layer 16 is deposited on the metal gate electrode 15a and the gate oxide layer 14, after which the silicon layer 16 is heat treated at a predetermined temperature so that the silicon layer 16 reacts with the metal gate electrode 15a, thereby forming a silicide layer 15b around a surface of the metal gate electrode 15a (see FIG. 1d).

Figure 1B:
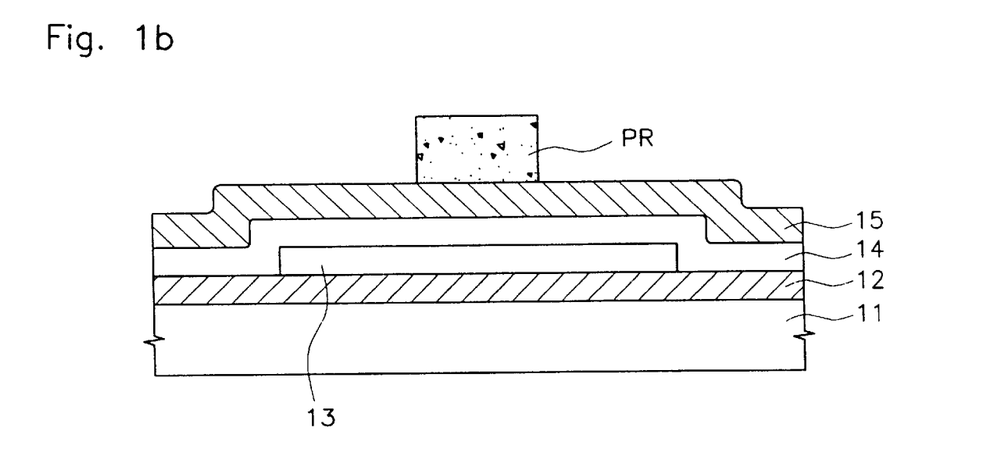
Figure 1C:
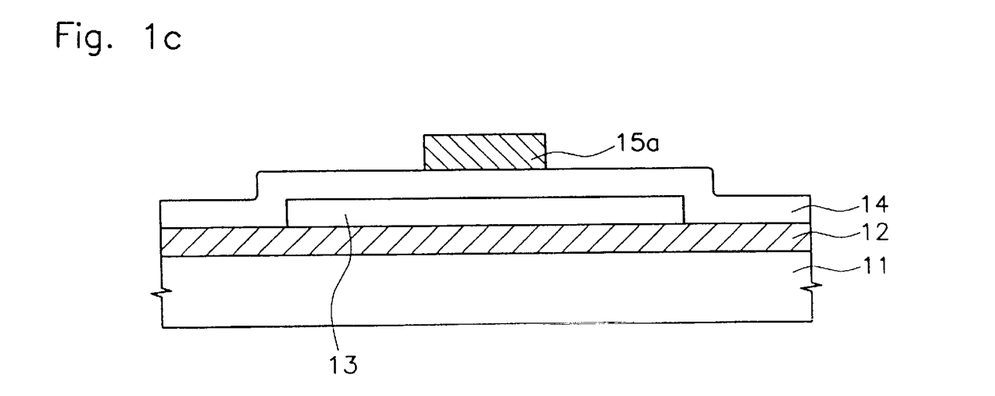
Figure 1D:
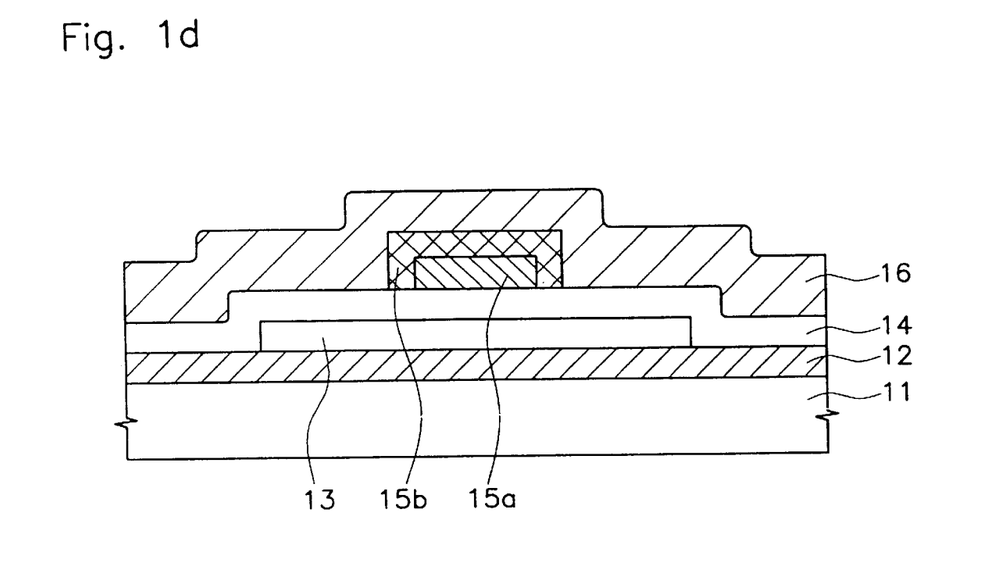
Figure 1E:
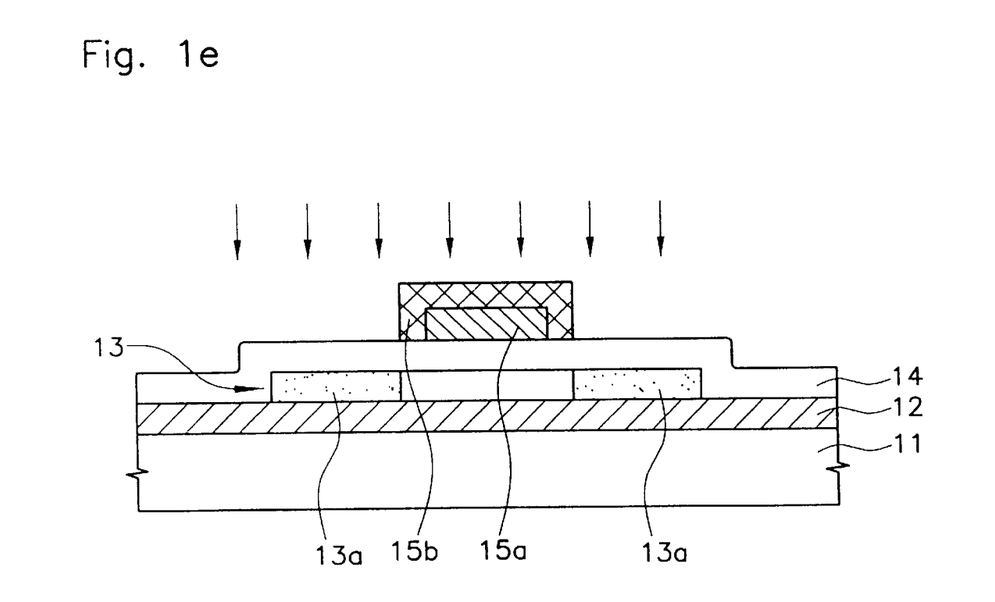

After the silicon layer 16 is removed, impurities are heavily doped in the active layer 13 using the silicide layer 15b as a mask, thereby forming a source/drain region 13a (see FIG. 1e).

Figure 1F:
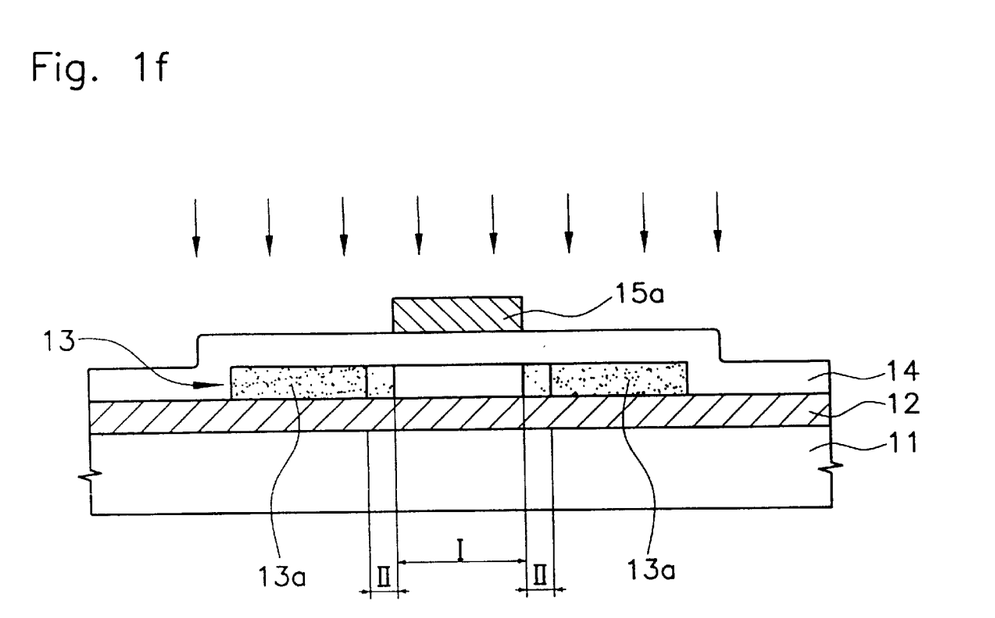

Following the above, the silicide layer 15b is removed, then impurities are lightly doped in the active layer 13 using the metal gate electrode 15a as a mask, thereby forming an offset region II (see FIG. 1f).

In the above described method, to form the metal gate electrode 15a, a photoresist is deposited on the metal gate electrode forming material 15, then exposed to a light to develop the same, thereby forming a photoresist pattern PR. Next, the metal layer 15 is etched using the photoresist pattern PR as a mask.

In addition, the temperature used for the heat treatment process in forming the silicide layer 15b is preferably in the range of 300 to 500° C., and the metal gate electrode forming material 15 is selected from the group consisting of cobalt (Co), chrome (Cr), iridium (Ir), manganese (Mn), nickel (Ni), palladium (Pd) and lead (Pt).

FIGS. 2a to 2f illustrate, in cross-section, a portion of a TFT as it undergoes sequential processing steps for being manufactured according to a second embodiment of the present invention.

Figure 2A:
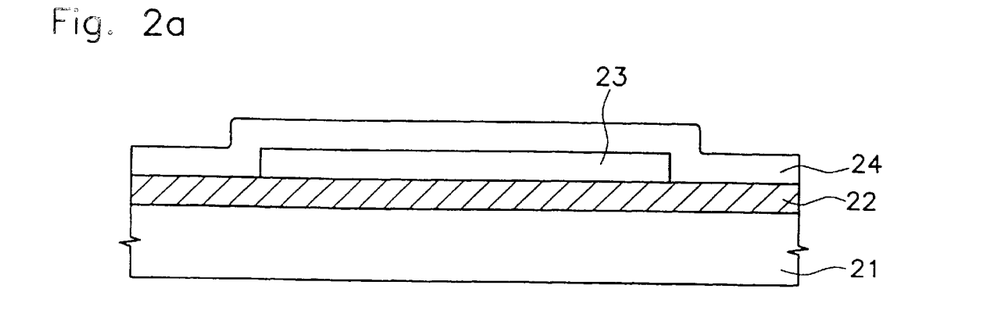
FIGS. 2a to 2f illustrate, in cross-section, a portion of a TFT as it undergoes sequential processing steps for being manufactured according to a second embodiment of the present invention.

Referring first to FIG. 2a, a buffer layer 22, an active layer 23, and a gate oxide layer 24 are first formed on a substrate 21 in this order. Next, a silicon layer 25 is deposited on the gate oxide layer 24, then a silicon gate electrode 25a is formed on the gate oxide layer 24 (FIG. 2c), after which impurities are lightly doped in the active layer 23 using the silicon gate electrode as a mask, thereby forming a lightly doped region 23a (FIG. 2d).

Figure 2B:
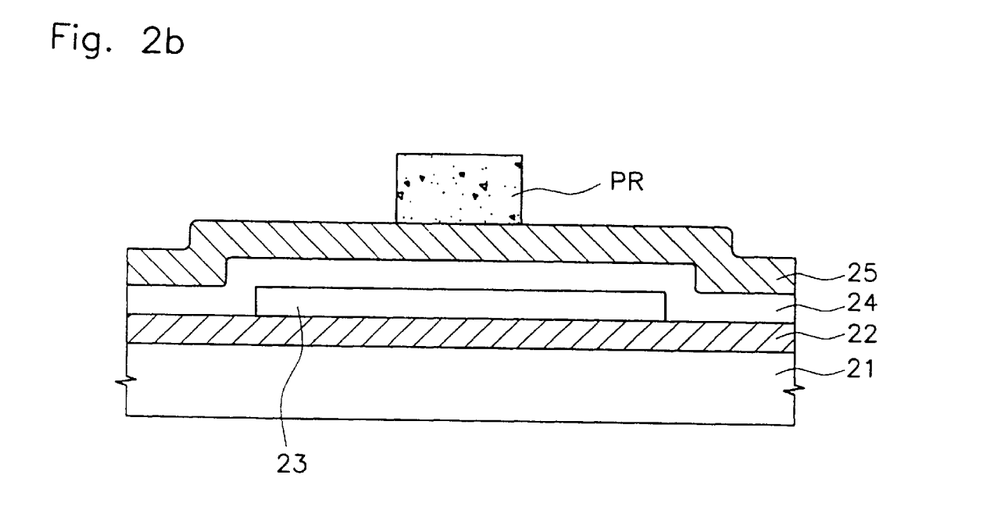
Figure 2C:
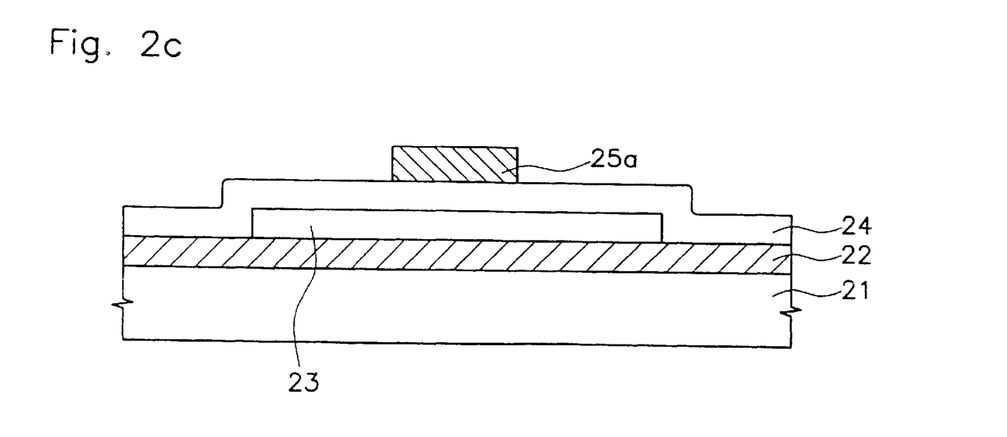
Figure 2D:
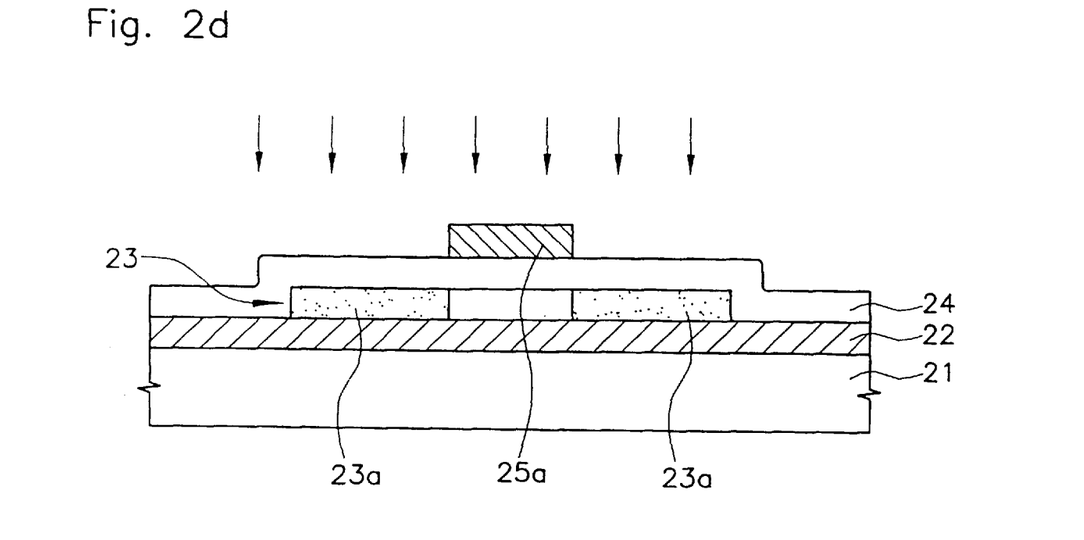
Figure 2E:
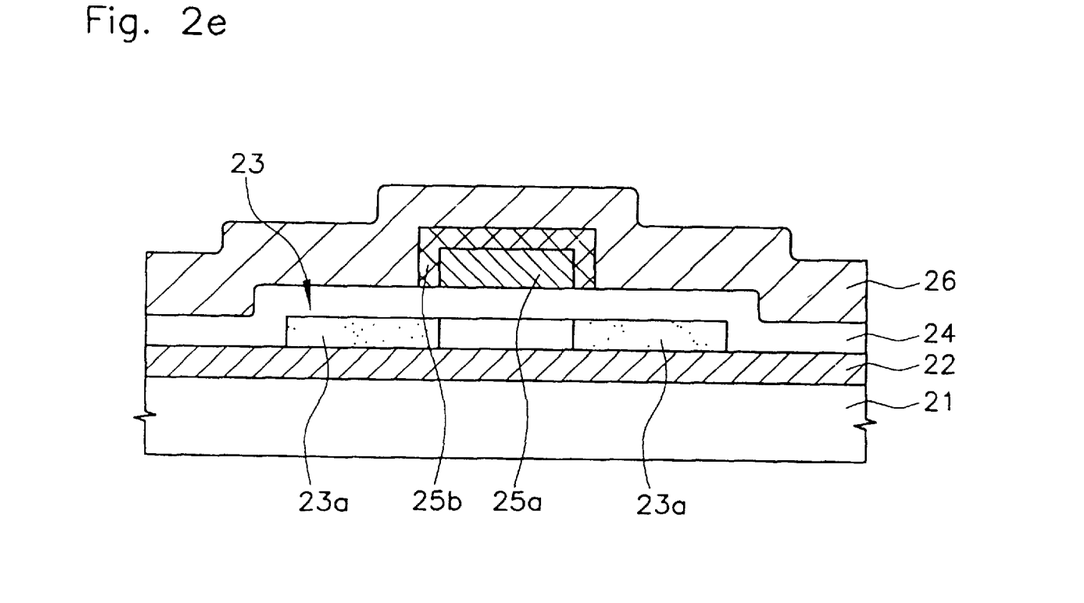

Following the above, as shown in FIG. 2e, a metal layer 26 is deposited on both the silicon gate electrode 25a and the gate oxide layer 24, after which the metal layer 26 is heat-treated at a predetermined temperature, thereby forming a silicide layer 25b around the silicon gate electrode 25a. After removing the metal layer 26, impurities are heavily doped in the active layer 23 using the silicide layer 25b as a mask, thereby forming a source/drain region 23b, while defining an offset region II (see FIG. 2f).

In the above described second embodiment, to form the silicon gate electrode 25a, a photoresist is deposited on the silicon layer 25, then exposed to a light to develop the same, thereby forming a photoresist pattern PR (see FIG. 2b). Next, the silicon layer 25 is etched using the photoresist pattern PR as a mask. The region between the offset region II is a channel region I.

In addition, the gate electrode may be formed of a metal material, and the first layer may be formed of a silicon material.

FIGS. 3a to 3i illustrate, in cross-section, a portion of a TFT as it undergoes sequential processing steps for being manufactured according to a third embodiment of the present invention.

Figure 3A:
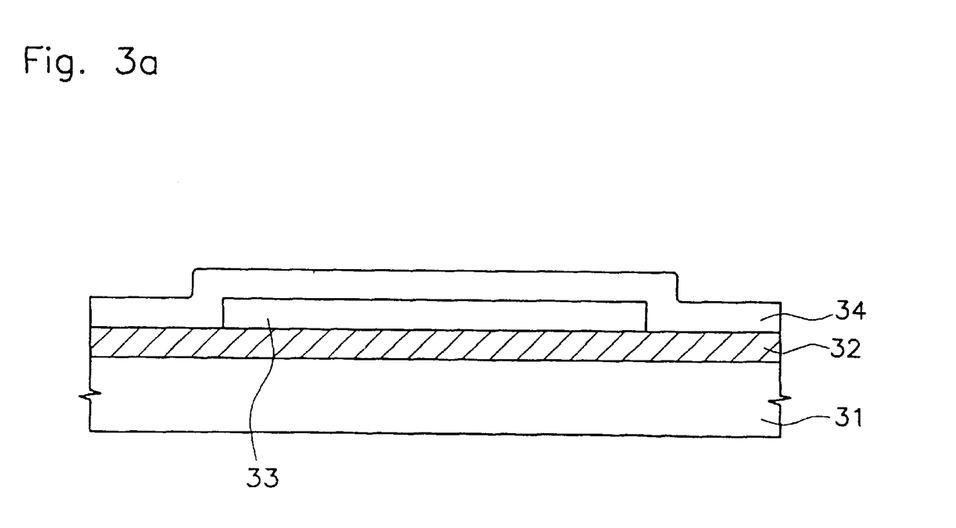
FIGS. 3a to 3i illustrate, in cross-section, a portion of a TFT as it undergoes sequential processing steps for being manufactured according to a third embodiment of the present invention.
Figure 3B:
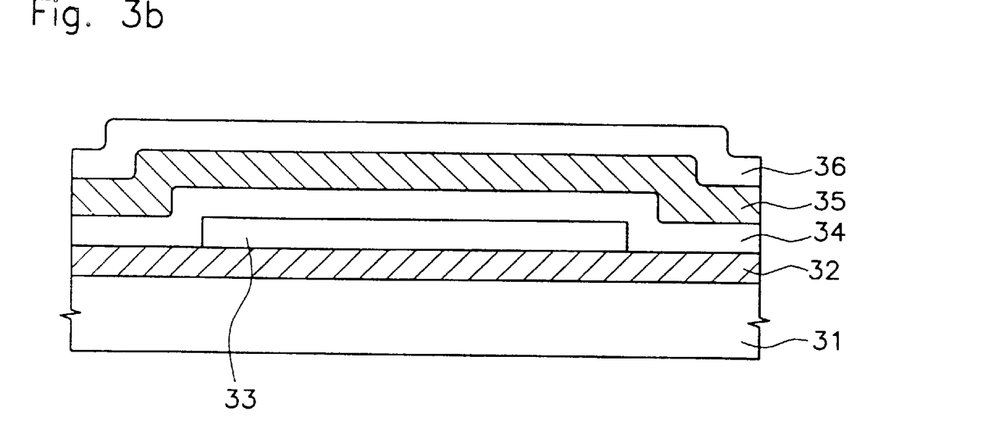
Figure 3C:
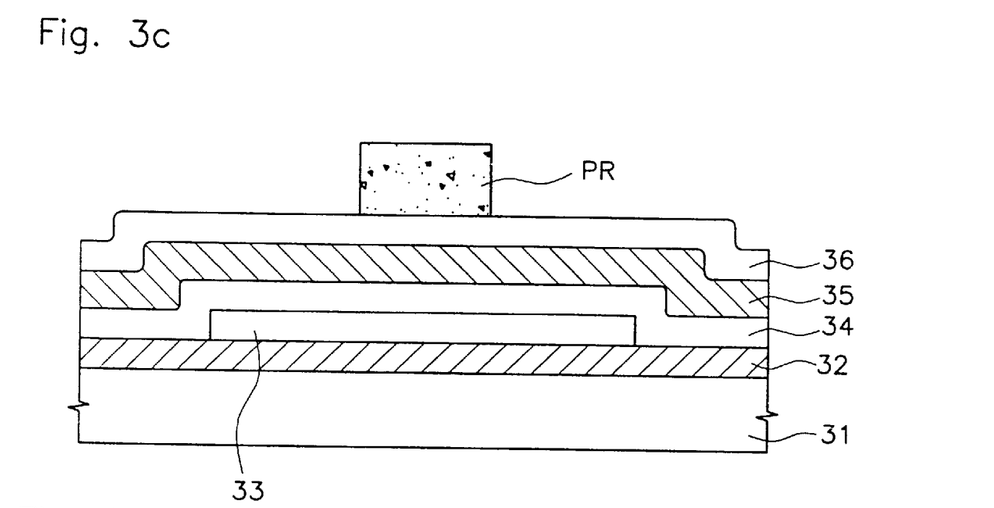
Figure 3D:
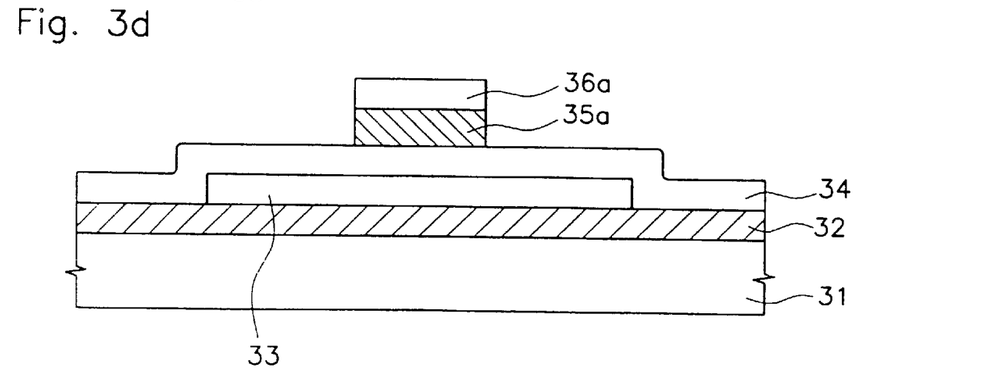
Figure 3E:
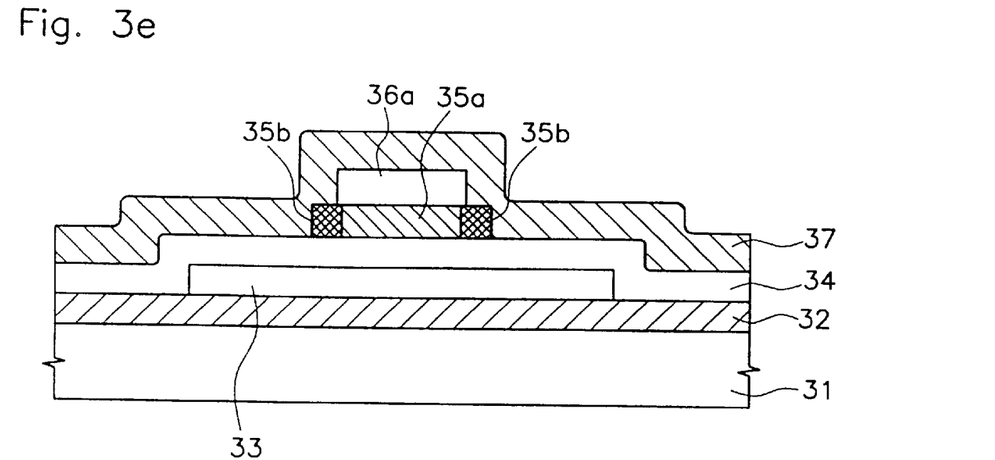

Referring first to FIG. 3a, a buffer layer 32, an active layer 33, and a gate oxide layer 34 are first formed on a substrate 31 in this order. Next, a metal layer 35 and a first layer 36 are deposited on the gate oxide layer 34 in this order (see FIG. 3b), after which the metal layer 35 and the first layer 36 are etched using a photoresist pattern PR as a mask, thereby obtaining a metal layer pattern 35a and a first layer pattern 36a (see FIGS. 3c and 3d). Next, as shown in FIG. 3e, a silicon layer 37 is deposited on the metal layer pattern 35a, the first layer pattern 36a and the gate oxide layer 34.

Figure 2F:
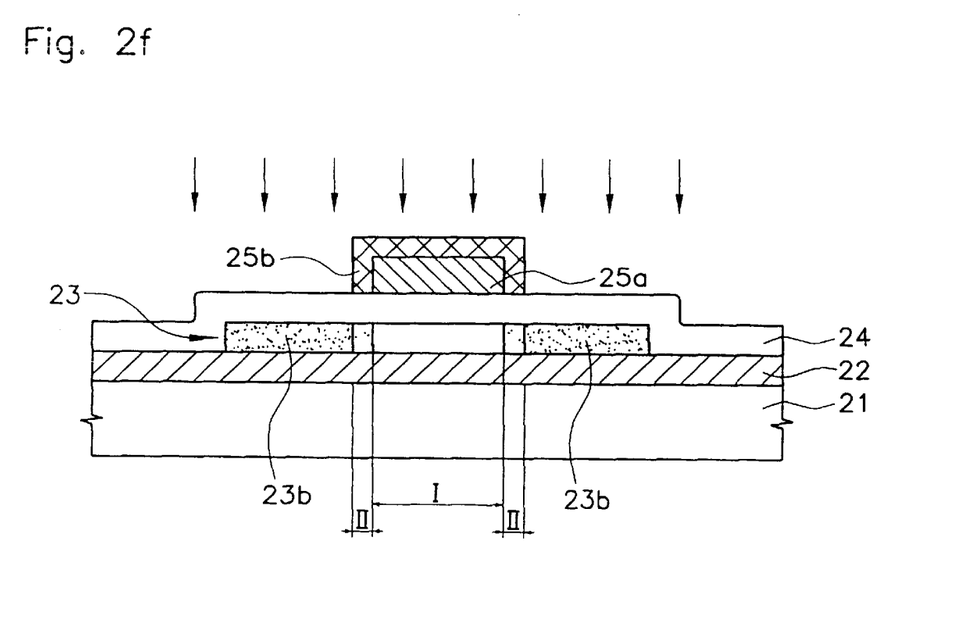

Following the above, the silicon layer 37 is heat-treated such that a silicide layer 35b is formed on a sidewall of the metal layer pattern 35a, after which the silicon layer 37 is removed (see FIG. 2f). Impurities are heavily doped in the active layer 33 using the silicide layer 35b as a mask, thereby forming a source/drain region 33a.

Figure 3F:
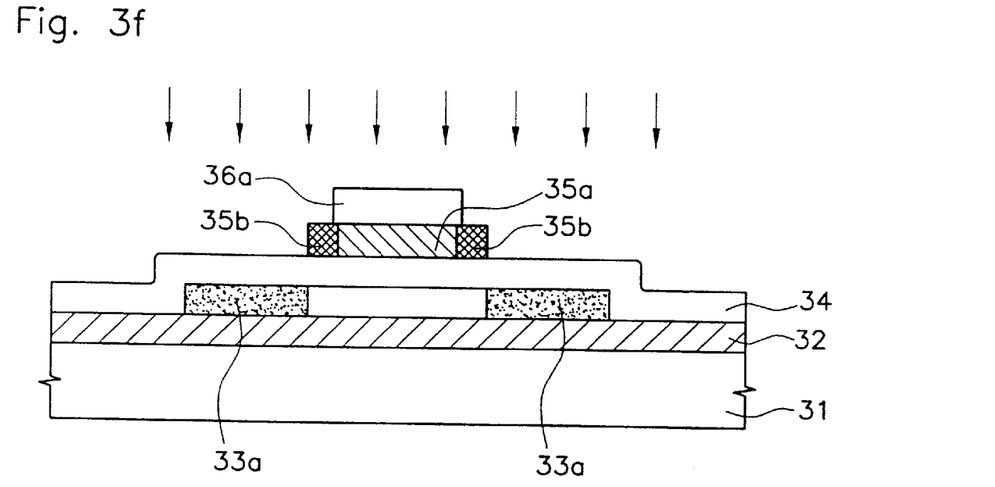
Figure 3G:
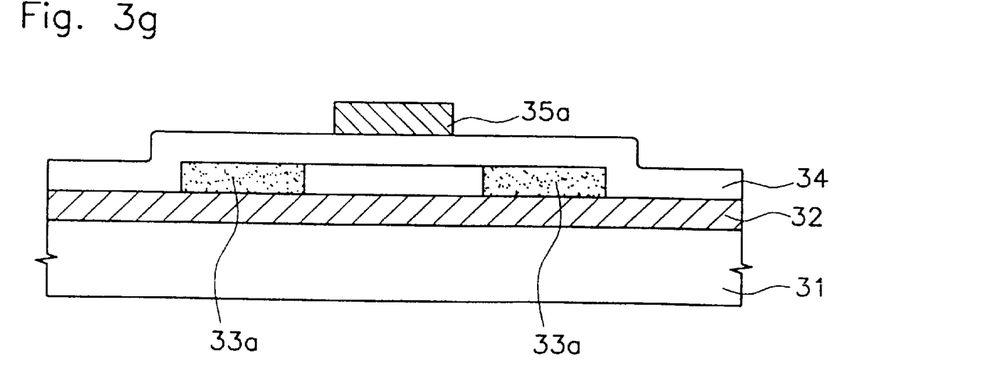
Figure 3H:
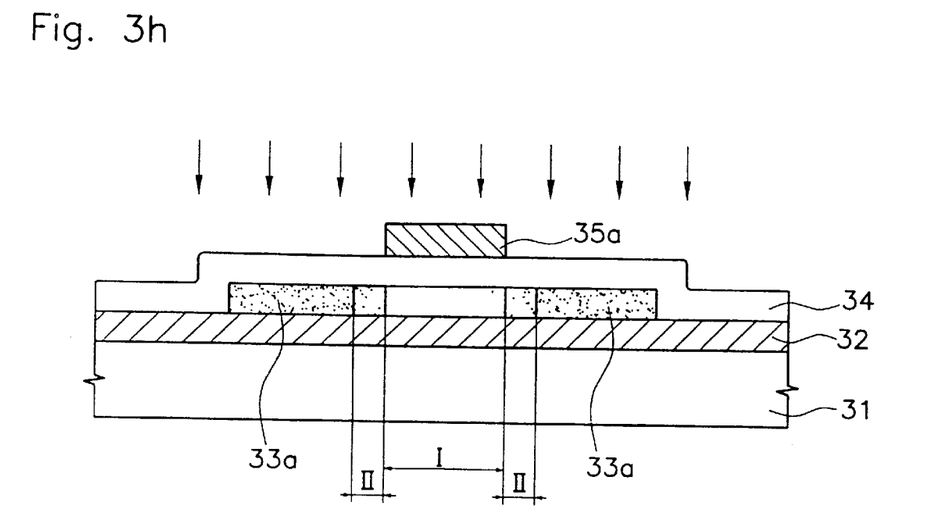
Figure 3I:
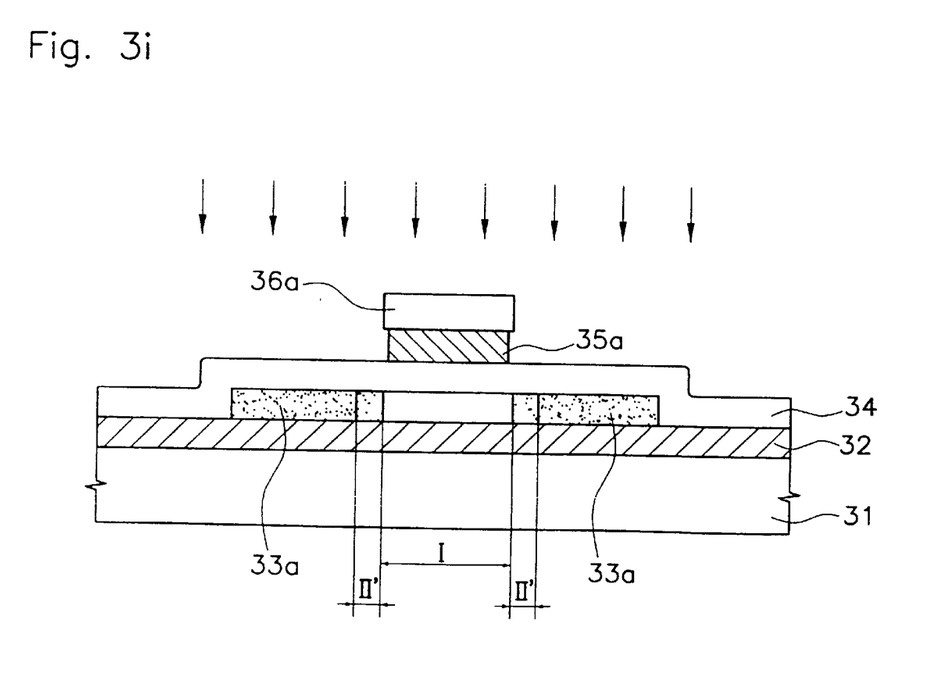

Next, the silicide layer 35b is removed (see FIG. 3g), then impurities are lightly doped on the active layer 33 using the metal layer pattern 35a as a mask, thereby forming an offset region II (FIG. 3h).

Preferably, the temperature used for the heat treatment process in forming the silicide layer 35b is preferably in the range of 300 to 500° C., and the metal layer is selected from the group consisting of cobalt (Co), chrome (Cr), manganese (Mn) and nickel (Ni) that can be easily formed into the silicide layer 35b at the temperature of 300 to 500° C., while the first layer 36 is made of a metal material selected from the group consisting of molybdenum (Mo), titanium (Ti), tungsten (W), and zirconium (Zr) that cannot easily be formed into the silicide layer 35b at the temperature of 300 to 500° C. or an insulating material selected from the group consisting of silicon oxide (SiO2) or silicon nitride SiNx. When the first layer pattern 36a is formed of one of the metal materials, this can be used as a gate electrode together with the metal layer pattern 35a, and when formed of one of the insulating materials, can be used as a protecting layer for the metal layer pattern 35a.

FIGS. 4a to 4h illustrate, in cross-section, a portion of a TFT as it undergoes sequential processing steps for being manufactured according to a fourth embodiment of the present invention.

Figure 4A:
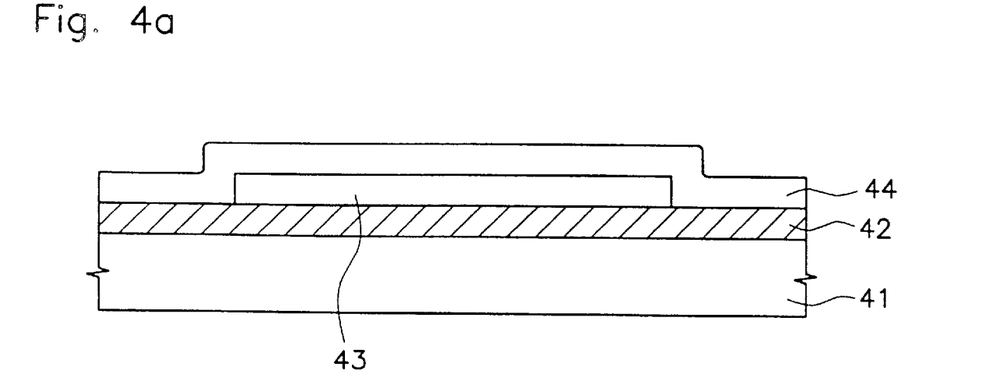
FIGS. 4a to 4h illustrate, in cross-section, a portion of a TFT as it undergoes sequential processing steps for being manufactured according to a fourth embodiment of the present invention.
Figure 4B:
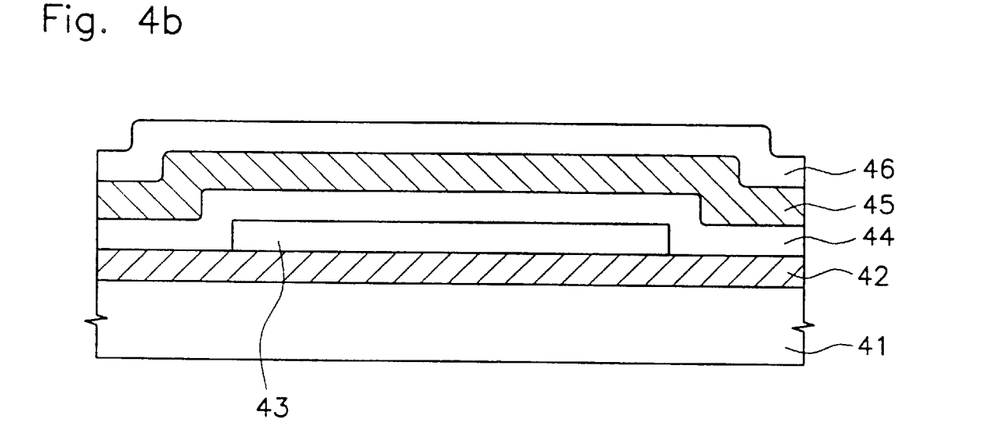
Figure 4C:
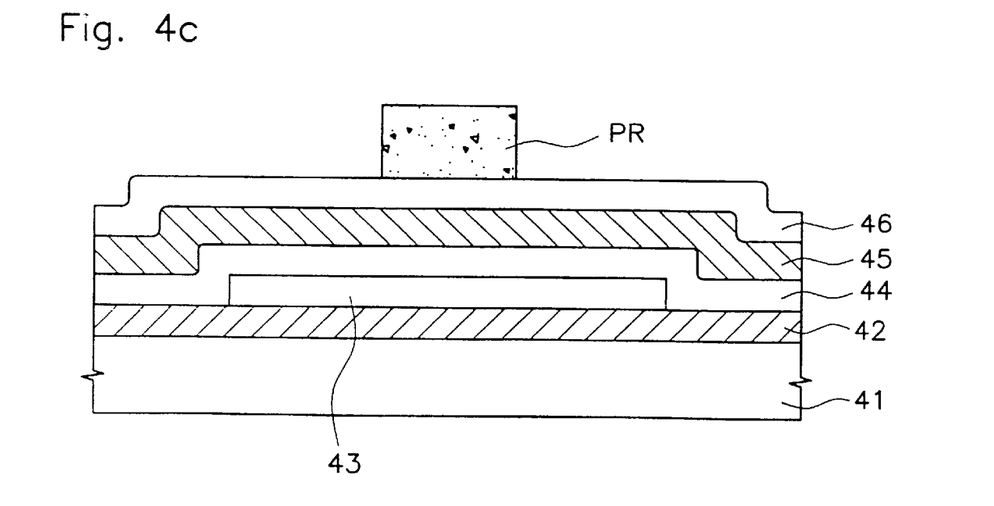
Figure 4D:
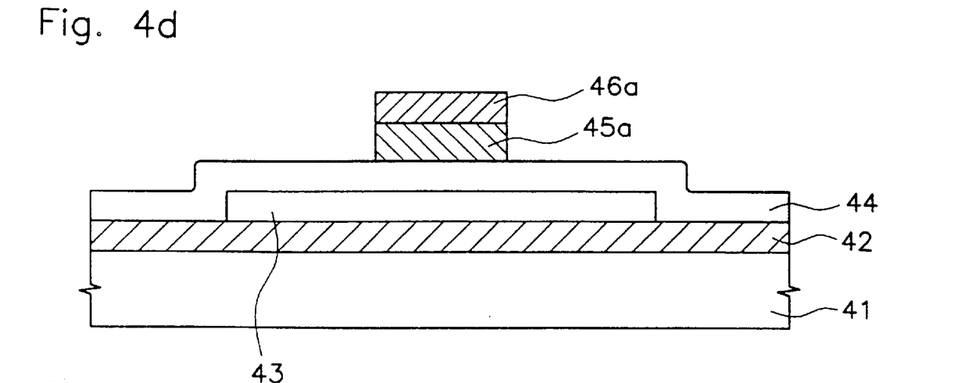
Figure 4E:
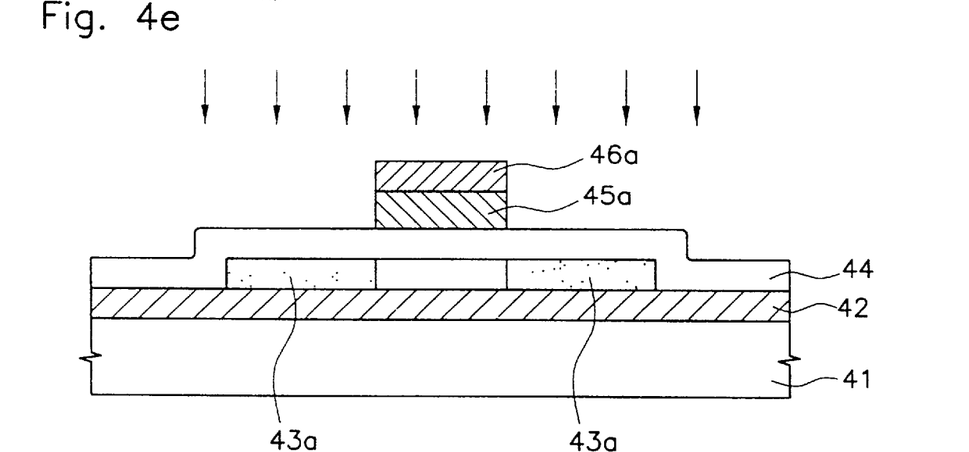

Referring first to FIG. 4a, a buffer layer 42, an active layer 43, and a gate oxide layer 44 are first formed on a substrate 41 in this order. Next, first and second metal layers 45 and 46 are deposited on the gate oxide layer 44 in this order (see FIG. 4b), after which the first and second metal layers 45 and 46 are etched using a photoresist pattern PR as a mask, thereby obtaining first and second metal patterns 45a and 46a (see FIGS. 4c and 4d). Next, impurities are lightly doped in the active layer 43 using the first and second metal patterns 45a and 46a as a mask, thereby forming a lightly doped region 43a (see FIG. 4e).

Figure 4F:
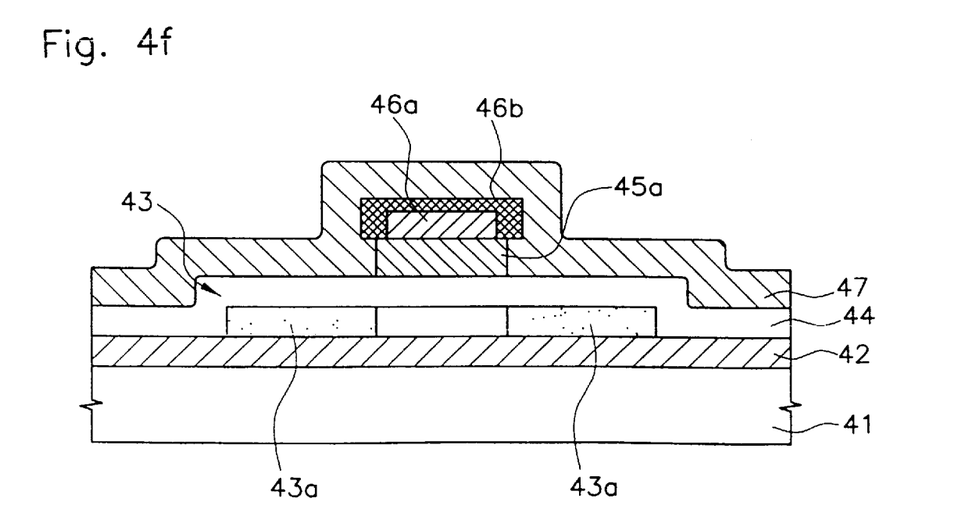

Following the above, as shown in FIG. 4f, a silicon layer 47 is deposited on the first and second metal patterns 45a and 46a and the gate oxide layer 44, after which the silicon layer 47 is heat-treated such that a silicide layer 46b is formed on a sidewall of the second metal pattern 46a.

Figure 4G:
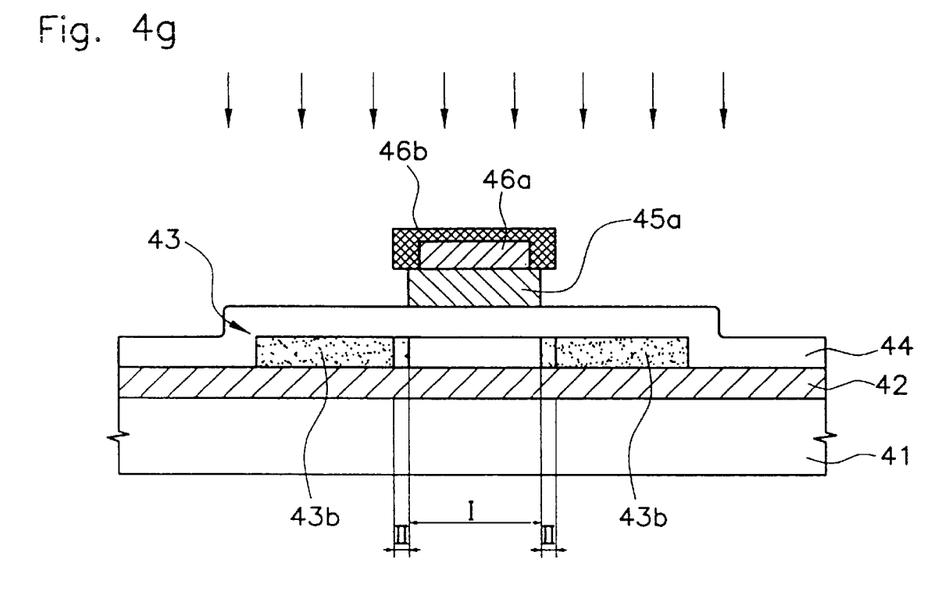
Figure 4H:
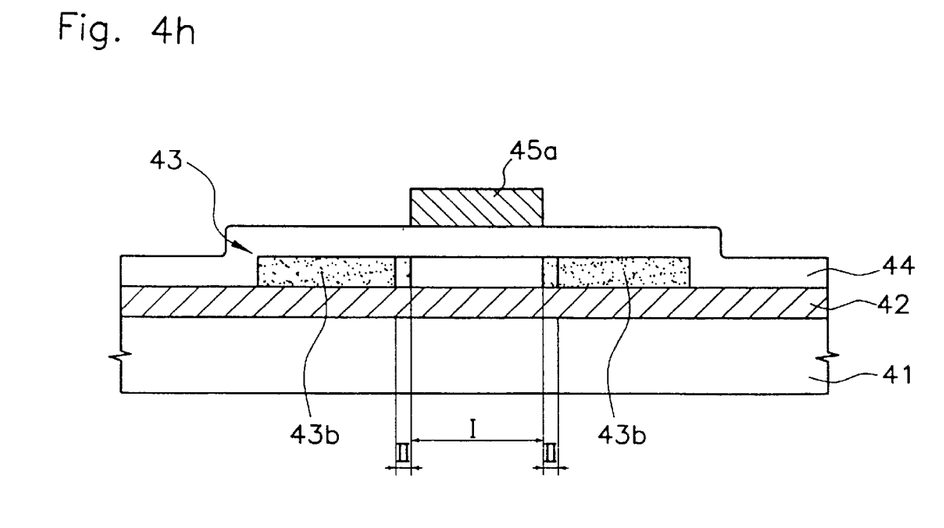

Next, after removing the silicon layer 47, impurities are heavily doped in the active layer 43 using the silicide layer 46b as a mask, thereby forming a source/drain region 43b, while defining an offset region II (see FIG. 4g). The silicide layer 46b and the second metal pattern 46a are then removed (see FIG. 4h).

Preferably, the temperature for the heat treatment process is in the range of 300 to 500° C., and the first layer 46 is made of a metal material selected from the group consisting of molybdenum (Mo), titanium (Ti), tungsten (W), and zirconium (Zr) that cannot easily be formed into the silicide layer 46b at the temperature of 300 to 500° C., while the second metal pattern 46a is selected from the group consisting of cobalt (Co), chrome (Cr), manganese (Mn) and nickel(Ni) that which can be easily formed into the silicide layer 46*b* at the temperature of 300 to 500° C.

As described above, since the silicide layer is formed around the gate electrode to form the offset region using a self-alignment method where the silicide layer is used as a mask, the substrate is not deformed and the gate electrode can be formed having a relatively high resistance, increasing the reliability.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method for fabricating a thin film transistor, comprising the steps of:

forming an active layer of a silicon on a substrate;

forming a gate oxide layer on the active layer;

forming a gate electrode on the gate oxide layer; and forming a silicide layer around the gate electrode.

2. The method of claim 1 further comprising the steps of:

heavily doping first portions of the active layer; and lightly doping second portions of the active layer.

3. The method of claim 1 further comprising the steps of:

lightly doping first portions of the active layer after the step of forming a gate oxide layer on the active layer; and heavily doping second portions of the active layer after the step of forming a silicide layer around the gate electrode.

4. The method of claim 1 wherein the step of forming a silicide layer around the gate electrode further comprises the steps of:

depositing a first layer over the gate electrode; and heat treating the first layer together with the gate electrode at a temperature sufficient for the first layer to react with the gate electrode to form the silicide layer.

5. The method of claim 4 wherein the gate electrode is of a silicon material and the first layer is of a metal.

6. The method of claim 4 wherein the gate electrode is of a metal and the first layer is of a silicon material.

7. The method of claim 6 wherein the metal is selected from the group consisting of cobalt (Co), chrome (Cr), iridium (Ir), manganese (Mn), nickel (Ni), palladium (Pd) and lead (Pt).

8. The method of claim 4 wherein the temperature is in the range of 300–500° C.

* * * * *